United States Patent [19]

Fernandes et al.

[11] Patent Number: 4,635,055

[45] Date of Patent: Jan. 6, 1987

[54] APPARATUS FOR MEASURING THE TEMPERATURE AND OTHER PARAMETERS OF AN ELECTIC POWER CONDUCTOR

[75] Inventors: Roosevelt A. Fernandes, Liverpool, N.Y.; William R. Smith-Vaniz, Darien, Conn.; John E. Burbank, III, Ridgefield, Conn.; Richard L. Sieron, Fairfield, Conn.

[73] Assignee: Niagara Mohawk Power Corporation, Syracuse, N.Y.

[21] Appl. No.: 564,924

[22] Filed: Dec. 23, 1983

Related U.S. Application Data

[63] Continuation-in-part of Ser. No. 484,681, Apr. 13, 1983.

[51] Int. Cl.$^4$ .............................................. B08C 19/00
[52] U.S. Cl. .............................. 340/870.17; 324/127; 323/357; 374/152
[58] Field of Search ................... 340/870.17; 374/152; 324/105, 117 R, 127, 129, 149; 323/357; 336/176

[56] References Cited

U.S. PATENT DOCUMENTS

| | | | |
|---|---|---|---|
| 3,742,764 | 7/1973 | Dauphinee | 324/117 R |
| 3,748,655 | 7/1973 | Engelhardt | 340/870.17 |
| 3,932,810 | 1/1976 | Kohler | 324/127 |
| 3,978,729 | 9/1976 | Jacobs | 340/870.17 |
| 4,100,488 | 7/1978 | Quietzsch | 324/117 R |
| 4,158,810 | 6/1979 | Leskovar | 324/127 |
| 4,324,255 | 4/1982 | Barach | 324/117 R |
| 4,384,289 | 5/1983 | Stillwell | 340/870.17 |

*Primary Examiner*—John W. Caldwell, Sr.
*Assistant Examiner*—Michael F. Heim
*Attorney, Agent, or Firm*—Lalos, Keegan & Kaye

[57] ABSTRACT

A self contained hot stick mounted radio transmitting module may be temporarily pushed against the power conductor of an electrical transmission line. The module is capable of measuring the temperature of the conductor, and the temperature of the ambient air. It may also measure the electrical potential of the conductor. An alternative module is also capable of measuring current, potential, frequency and power factor (or the Fourier components thereof). The modules transmit these parameters to a local receiver where the data may be displayed. The receiver also may be connected by an appropriate data transmission link, to a power control center.

The modules are donut shaped and open like a pair of jaws. One or more spring loaded temperature probes are located such that they may be pushed against a power line when a "donut" is mounted to a hot stick with the jaws open.

Power to an open module is supplied by a battery. Power to a closed module, mounted on a conductor, may be supplied by the battery or by power derived from the conductor.

A donut may be left on the power line for an indefinite time and the hot stick removed, or instantaneous measurements may be made with the hot stick attached, and the module then immediately removed.

The temperature probe of the present invention comprises a pair of concentric spring loaded tubes. A beryllia insert is mounted between a temperature sensor and the power conductor.

17 Claims, 8 Drawing Figures

APPARATUS FOR MEASURING THE TEMPERATURE AND OTHER PARAMETERS OF AN ELECTIC POWER CONDUCTOR

RELATED APPLICATIONS

This application is related to the prior U.S. Pat. No. 4,384,289, of Howard R. Stillwell and Roosevelt A. Fernandes entitled TRANSPONDER UNIT FOR MEASURING TEMPERATURE AND CURRENT ON LIVE TRANSMISSION LINES, issued May 17, 1983, which patent is incorporated herein by reference; and to the U.S. patent application Ser. No. 484,681, of Roosevelt Adolfo Fernandes, William Reid Smith-Vaniz, John Emerson Burbank III and Richard Leonard Sieron, entitled SYSTEM AND APPARATUS FOR MONITORING AND CONTROL OR A BULK ELECTRIC POWER DELIVERY SYSTEM, filed Apr. 13, 1983, which application is incorporated herein by reference. This application is a Continuation-in-Part of the latter application.

TECHNICAL FIELD

This invention relates to apparatus for measuring the temperature and other parameters of an electric power conductor. More particularly it relates to the temporary use of the modules disclosed in the above-identified co-pending application and patent to make short term measurements of power line temperture potential, current, power factor and the like.

The novel temperature sensor of the donut module of the invention make possible the use of the module as a hot stick mounted power line temperature probe.

BACKGROUND ART

Various power line sensors have been disclosed in the prior art. For example, see U.S. Pat. Nos. 3,428,896, 3,633,191, 4,158,810 and 4,268,818. It has been proposed to use sensors of this type and of the greatly improved form disclosed in the above-identified Stillwell and Fernandes patent for dynamic line rating of electrical power transmission lines. See for example, papers numbered 82 SM 377-0 and 82 SM 378-8 entitled DYNAMIC THERMAL LINE RATINGS, PART I, DYNAMIC AMPACITY RATING ALGORITHM; and, DYNAMIC THERMAL LINE RATINGS, PART II, CONDUCTOR TEMPERATURE SENSOR AND LABORATORY FIELD TEST EVALUATION; papers presented at the Institute of Electrical and Electronic Engineers P.E.S. 1982 summer meeting. These papers are incorporated herein by reference. However, the full potential of this new technology has not been realized.

It is desirable to measure the temperature of a power conductor at any arbitrary position along it to seen that the maximum permitted temperature has not been exceeded and to derive the dynamic state characteristics of the conductor. It is also desirable to be able to measure potential, current, and power factor for short times at arbitrary positions.

DISCLOSURE OF THE INVENTION

Figure 1:
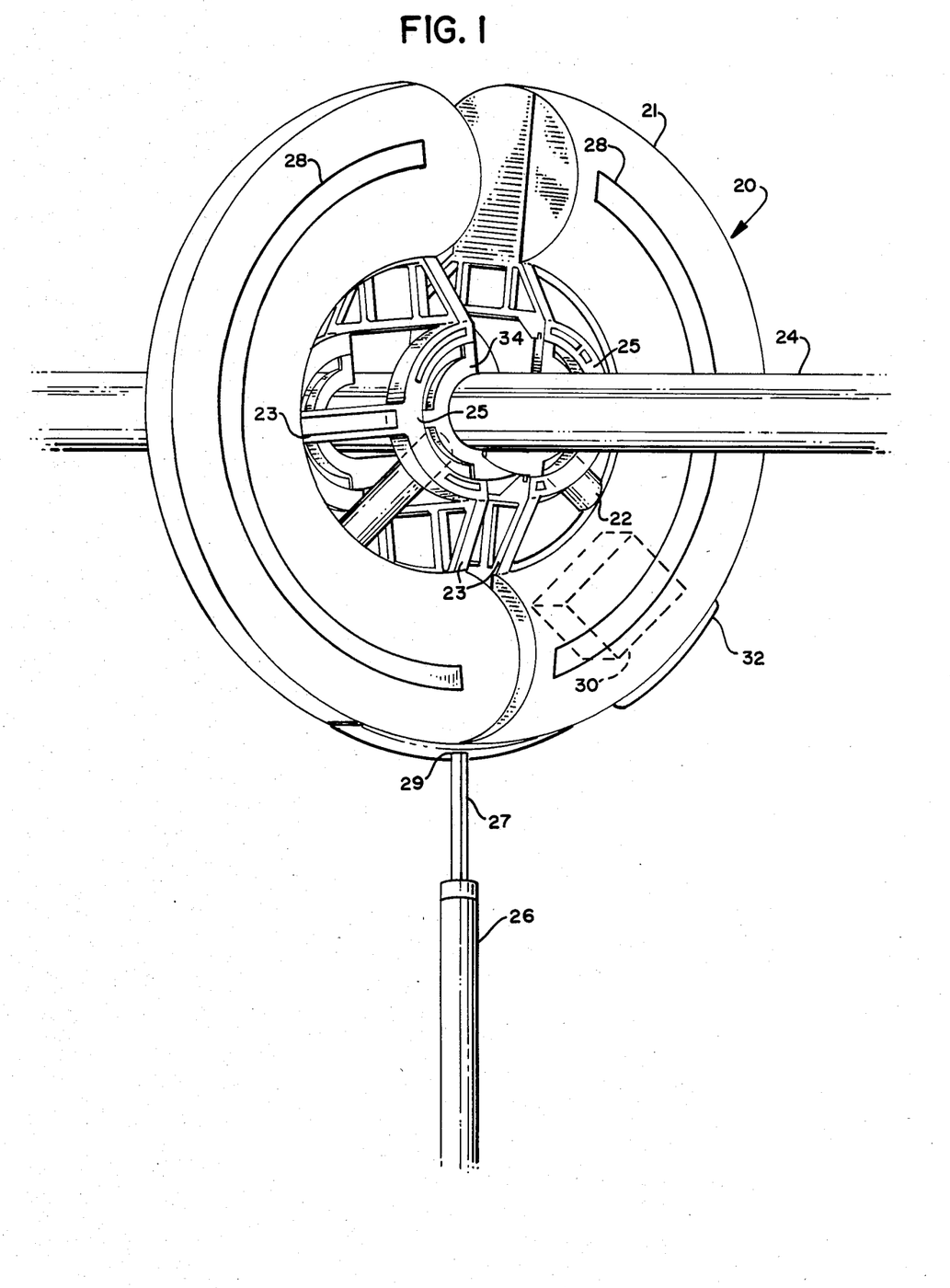
FIG. 1 is a perspective view of apparatus according to the invention for measuring the temperature and at least one other parameter of an electrical power conductor.

Referring to FIG. 1, a hot stick mounted temperature measuring device is generally indicated at 20. It comprises a pair of spring loaded temperature probes 22 which may be pressed against power conductor 24 when the unit 20 is mounted to a hot stick 26.

The unit 20 may also be provided with a pair of conductor potential measuring capacitor plates 28—28 so that the potential of the conductor 24 may be measured as well. A battery 30 supplies the power to the unit 20 and data is transmitted to the ground via patch antenna 32, or other suitable means.

The unit illustrated in FIG. 1 is not adapted to be closed about the power conductor 24 for permanent or semipermanent installation. It is therefore provided with a unitary cable stop 34 and is permanently fixed in the open jaws-like position shown.

Figure 2:
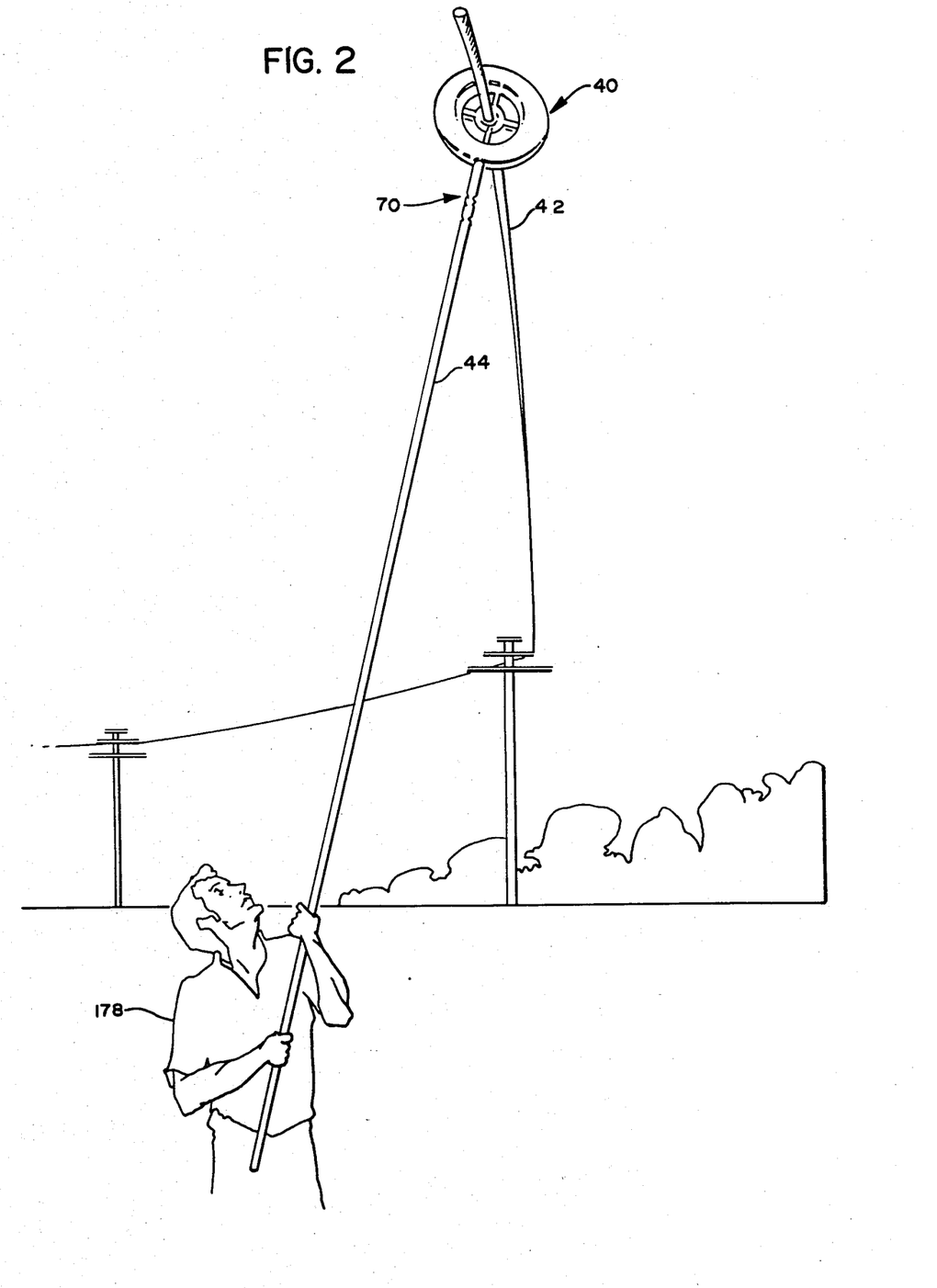
FIG. 2 is a perspective view of an alternative apparatus according to the invention for measuring temperature and other parameters of an electrical power conductor, and capable of being used for any desired length of time.

FIG. 2 shows how a closable unit 40, as disclosed in the above-identified co-pending application, may be mounted to a power conductor 42 for temporary or permanent use via a hot stick 44. The unit 40 is provided with a pair of conductor potential measuring capacitor plates 46—46 (FIG. 4), a Rogowski coil 48 for measuring the current (FIG. 6), and a power deriving magnetic core 50 (FIG. 5). The closable unit illustrated in FIGS. 2 through 8 may be provided with a battery 52 (FIG. 8) for supplying power when it is opened and its power supply module 292 may be provided with appropriate means for switching from battery power to power supplied by the magnetic core 50 and the unit is closed.

Figure 6:
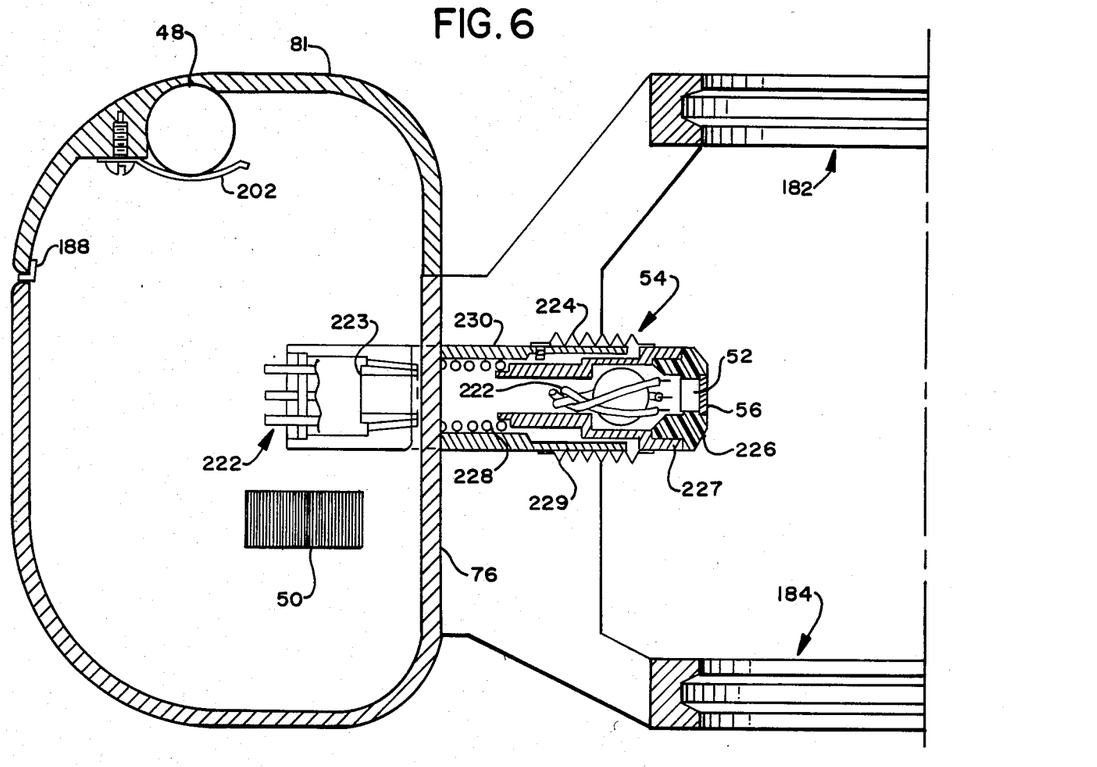
FIG. 6 is a perspective view taken along the line 6—6 of FIG. 5.

Now referring to FIG. 6, the temperature probes of both the unit 20 illustrated in FIG. 1 and the unit 40 illustrated in FIGS. 2 through 8, comprise a commercial temperature sensor 52 mounted at the end of the spring loaded temperature probe generally indicated at 54. A beryllia insert 56 is mounted in heat conducting contact with the temperature sensor 52 and presses against the conductor (not shown). The insert 56 is a good conductor of heat, a poor conductor of electricity, does not create any galvanic action with either aluminum or copper conductors, and because of its hardness, provides a self-cleaning action at the conductor surface.

Figure 3:
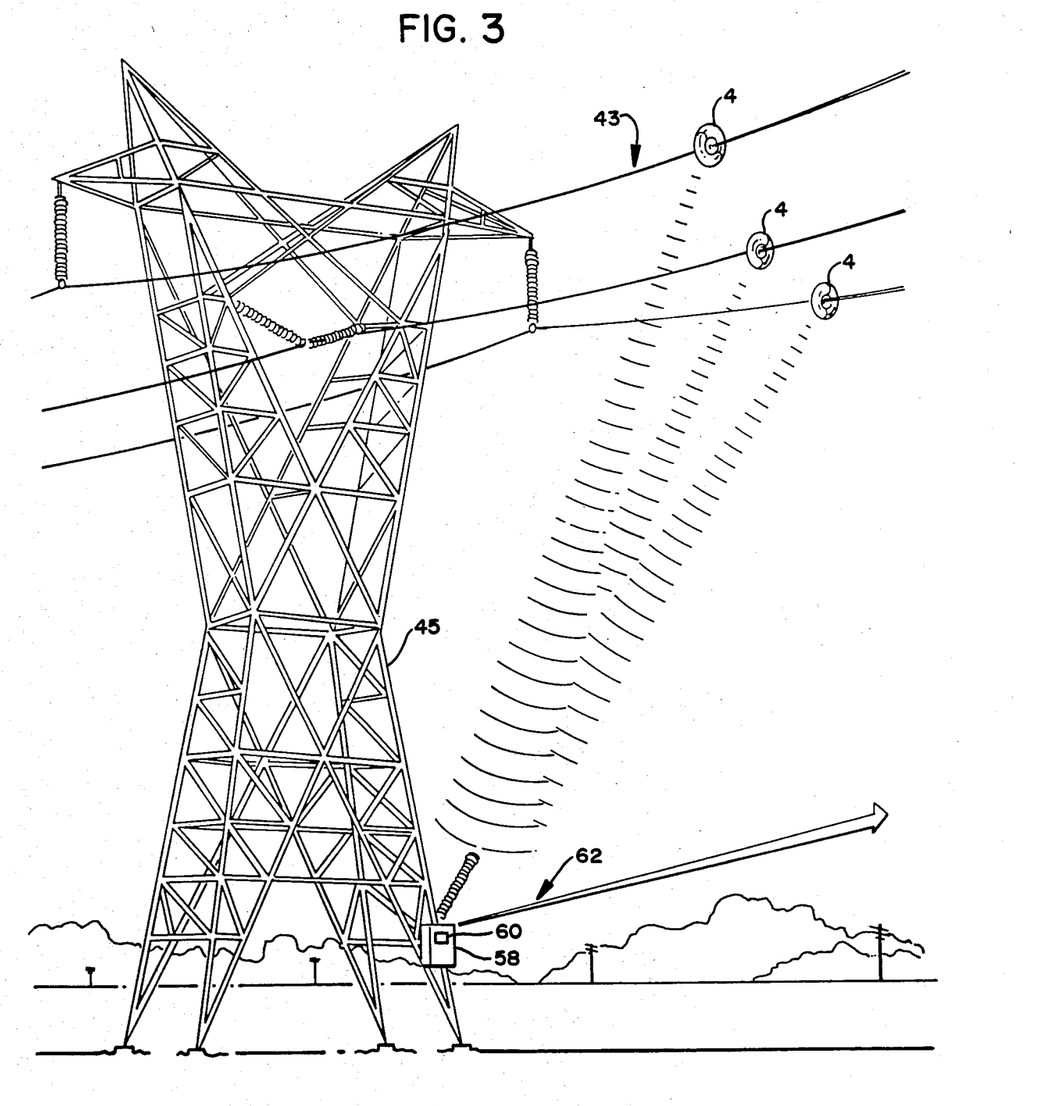
FIG. 3 is a perspective view showing how three modules as shown in FIG. 2 may be mounted to the three conductors of an electric power line.

Now referring to FIG. 3, the units of the invention transmit their measurements to a ground station 58 which is provided with a readout 60 for presenting the readings to a person on the ground. The ground station 58 may also be provided with radio, telephone or other communication means for transmitting the readings to a central power station. This communcations link is generally indicated at 62. While the transmission means utilized herein is a radio link, other appropriate methods could be employed, such as infra-red transmission.

OBJECTS OF THE INVENTION

It is therefore an object of the invention to provide apparatus for measuring the temperature of an electric power conductor.

Another object of the invention is to provide apparatus of the above character which is hot stick mounted.

A further object of the invention is to provide apparatus of the above character capable of transmitting measurements to the ground.

Still another object of the invention is to provide apparatus of the above character which may be left on the power conductor for an indefinite time.

Yet still another object of the invention is to provide apparatus of the above character which is also capable of measuring electrical parameters such as potential, current, and power factor.

Other objects of the invention will in part be obvious and will in part appear hereinafter. The invention accordingly comprises the features of construction, elements and arrangements of parts, which will be exemplified in the constructions hereinafter set forth. The scope of the invention is indicated in the claims.

BRIEF DESCRIPTION OF THE DRAWINGS

For a fuller understanding of the nature and objects of the invention, reference should be had to the following detailed description taken in connection with the accompanying drawings, in which.

The same reference characters refer to the same elements throughout the several views of the drawings.

BEST MODE FOR CARRYING OUT THE INVENTION

A hot stick mounted temperature measuring module generally indicated at 20 is shown in FIG. 1. The module 20 is generally C-shaped and has a generally toroidal cross section. It comprises a housing 21 to which spring loaded temperature probes 22 are mounted at an angle of less than 180° so that they may be pushed up into engagement with a power cable 24 when the unit 20 is mounted on a hot stick 26. The module 20 is provided with redial open webs 23 supporting four hub-like portions 25, only two of which are shown.

Mounted in the hub-like portions 25 are a pair of cable stop plates 34.

The housing 21 is permanently fixed in the open position shown. The hot stick 26 is provided with a rod 27, the outer end of which is threaded (not shown), for engagement with a complimentary threaded portion within the housing 21 at 29.

The housing 21 also contains a battery 30 for powering the unit and electronics for transmitting the readings from the temperature probes 22 and transmitting them via a patch antenna 32, or other appropriate means, to the ground.

The module 20 may also have a pair of capacitor plates 28—28 for measuring the potential of the conductor 24 and this measurement may also be transmitted to the ground.

A measurement is taken by mounting the module 20 on the hot stick 26 and then pushing it until the cable stop plates 34 engage the cable 24. The temperature probes 22 will then be pressed resiliently by springs against the cable and their readings transmitted to the ground.

Alternatively, as shown in FIG. 2, a module 40 employing a hinge clamp as disclosed in the above-identified co-pending application, may be mounted to a conductor 42 via hot stick 44 for indefinite mounting on the conductor 42. The hot stick 44 may be removed from the unit 40 until it is desired to remove it from the conductor 42. Thus several units 42 may be mounted to the three phase conductors of an electrical power line generally indicated at 43 in FIG. 3. Their measurements are transmitted to a ground receiver 58 which may be mounted on an electrical transmission tower 45, if desired, and are displayed on a display 60. As more fully described in the above-identified co-pending application, the ground station 58 may be provided with various forms of transmission links 62 for transmitting the measurements to a central station.

The modules 40 ("Donuts") clamp to a high-tension power conductor 42 and telemeter power parameters to a ground station 58 (FIG. 3). Each module obtains it operating power from the magnetic field generated by the current flowing in the high-tension conductor 42. Each module is relatively small and shaped like a donut, with a $12\frac{5}{8}''$ major diameter and a maximum thickness of $4\frac{3}{4}''$. It weighs approximately 16 pounds and may be mounted in the field in a matter of minutes using a "hot stick" (FIG. 2).

Each donut is equipped to measure line current, line to neutral voltage, frequency, phase angle, conductor temperature and ambient temperature. Digital data is transmitted by means of a 950 MHz FM radio link in a 5–10 millisecond burst. A microcomputer at the ground station 58 processes the data from, for example, the 3 phase set of FIG. 3 and calculates any desired power parameter such as total circuit kilowatts, kilovars, and volt-amps, Individual conductor current and voltage is also available. This data may then be passed on to a central monitoring host computer (typically once a second) over a data link 62.

Environmental operating conditions include an ambient air temperature range of $-40°$ F. to $+100°$ F.; driving rain, sleet, snow, and ice buildup; falling ice from conductor overhead; sun loading; and vibrations of conductors 22.

Current measurements over a range of 80–3000 amperes must be accurate to within 0.5%. Voltage measurements over a range of 2.4–345 KV (line-line) must be accurate to within 0.5%. Conductor diameters range from 0.5 to 2 inches.

All exterior surfaces are rounded and free from sharp edges so as to prevent corona. The module weighs approximately 16 pounds. It is provided with clamping inserts for different conductor diameters which are easily removable and replaceable.

The special hot stick tool 70 (FIG. 4) is inserted into the donut 20. Turning of the hot stick causes the donut to split so that it may be placed over a conductor. Turning the hot stick in the opposite direction causes the donut to close over a conductor and clamp onto it tightly. The tool 70 may then be removed by simply pulling it away. Reinsertion and turning will open the donut and allow it to be removed from the line.

Conductor temperature probes 54 and 72 (FIGS. 4, 5, and 6) are spring loaded against the conductor when the donut is installed. The contacting tip 56 (FIG. 6) is beryllia and inhibits corrosion and yet conducts heat efficiently to the temperature transducer 52 within. It is a non-conductor of electricity so as not to create a low resistance path from the conductor to the electronics. It does not create any galvanic action with the conductor. The beryllia insert is very hard and abrades any corrosion on the conductor, thus providing good heat conductive contact.

The hub and spoke area in the center of the donut 20 and the temperature probe placement are designed with as much free space as possible so as not to affect the temperature of the conductor.

All electronics within the donut are sealed in watertight compartments.

The radio frequency transmitter power of the donut 20 is typically 100 milliwatts. However, it may be as high as 4 watts. The donut 20 is protected against lightning surges by MOV devices and proper grounding and shielding practice. All analog and digital circuitry is CMOS to minimize power consumption.

No potentiometers or other variable devices are used for calibration in donut 40. All calibration is done by the ground station 58 by scaling factors recorded in computer memory.

Current is measured by using a Rogowski coil 50 (FIG. 5). Voltage is measured by two electrically insulated strips of metal 46—46 (FIG. 4) imbedded flush on the exterior of one face of the donut. These strips act as one plate of a capacitor at the potential of the conductor. The other plate is the rest of the universe and is essentially at calibrated ground (neutral) potential with respect to the donut. The amount of current collected by the donut plate from ground is thus proportional to the potential of the donut and the conductor on which it is mounted.

Power to operate donut electronics is derived from a winding 68 on a laminated iron core 64–66 which surrounds the line conductor. This core is split to accommodate the opening of the donut when it clamps around the conductor.

More specifically, and referring to FIG. 2, the hot stick tool 70 may be mounted on a conventional hot stick 44 so that the module 40 may be mounted on an energized conductor 42 by a man 178.

Figure 4:
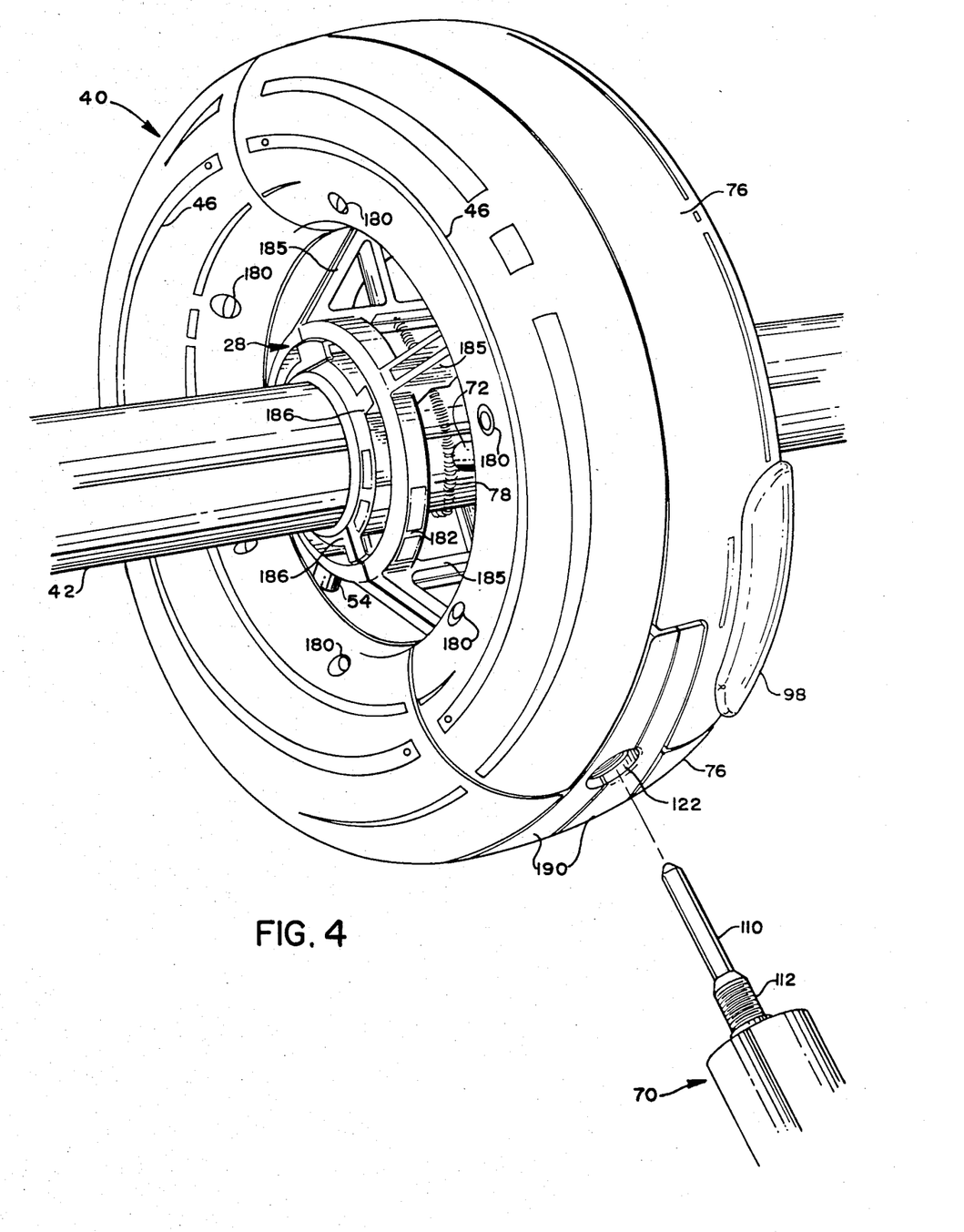
FIG. 4 is a perspective view of the module illustrated in FIG. 2.
Figure 5:
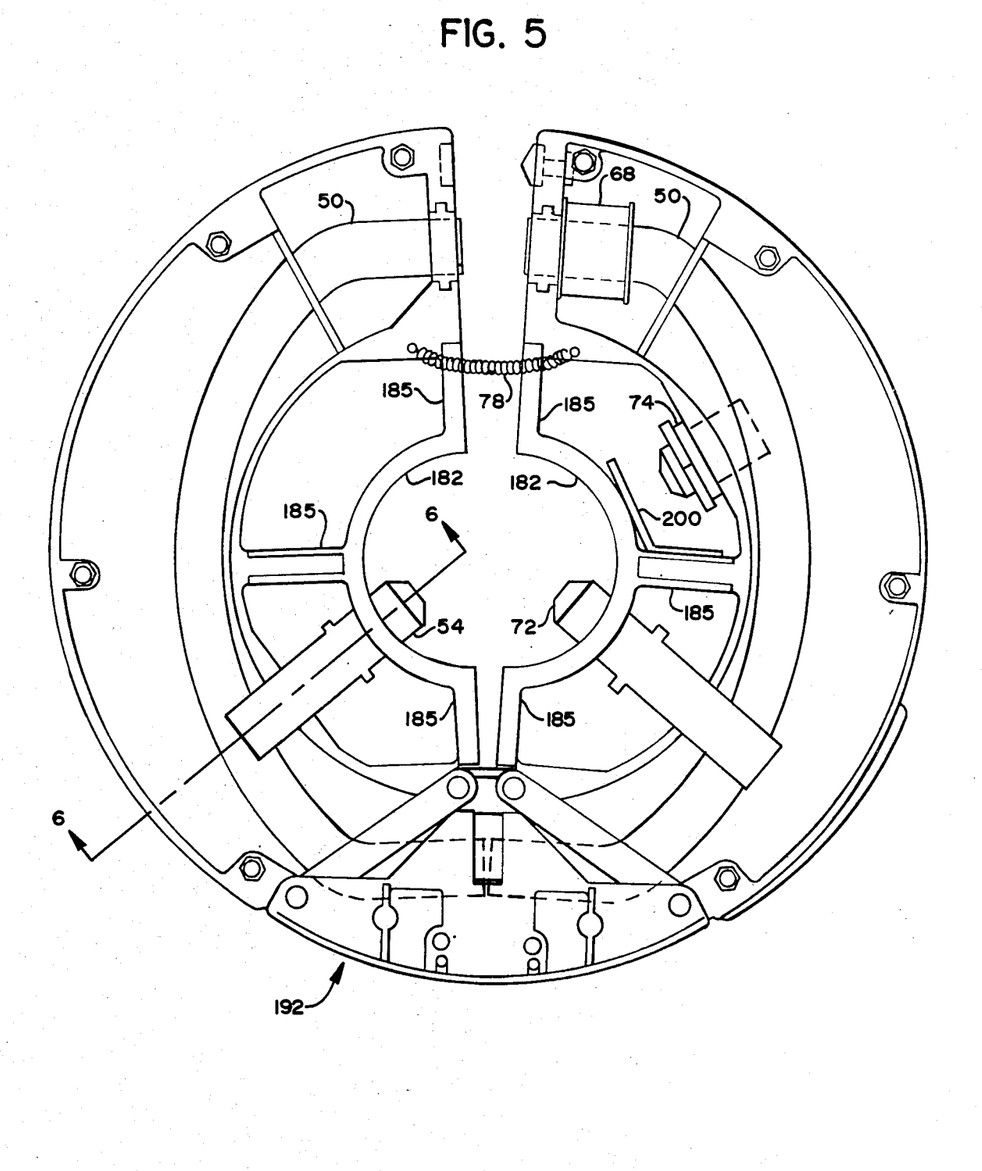
FIG. 5 is a top view of the bottom portion of the module illustrated in FIG. 2.

In FIG. 4 it can be seen how the hot stick tool 108 provided with an Allen wrench portion 110 and a threaded portion 112 fits within a hole 122 provided in the donut 40 mounted on conductor 42. The donut comprises two bottom portions 76 and two covers, or top portions 81, held together by six bolts 180. Each bottom portion 76 is provided with a top hub 182 and a bottom hub 184 (see also FIG. 6), supported on three relatively open spokes 185.

Conductor temperature probes 54 and 72 are located so that the donut 40 may be utilized for an instantaneous temperature measurement in its open condition in the same manner as donut 20 of FIG. 1.

Identical clamping inserts 186 are held within opposed hubs 182 and 184 (see also FIG. 7) and clamp conductor 22 with hard rubber facings (not shown) provided therein. The tops 81 of the donut 40 (FIG. 4) are each provided with an arcuate flat flush conductor 46 insulated from the housing for measuring voltage and one of the bottom portions 76 is provided with a patch antenna 98, or other suitable means, for transmitting data to the ground station.

Although the top portions 81 are each provided with a non-conductive rubber seal 188 (FIG. 6) and the area around the hinge is closed by cover plates 190, water escape vents are provided in and around the access opening 122, which due to the hot stick mounting is always at the lower portion of the donut 40 when installed on a conductor 42.

Now referring to FIG. 5, a hinge mechanism is provided, generally indicated at 192. It is disclosed in detail in the above-identified co-pending application.

Again referring to FIGS. 4 and 5, to make certain that the bottom portions 76—76 of the donut 20 are at the potential of the conductor, a spring 78 is provided which continuously contacts the conductor during use and contacts it before it comes in contact with the temperature probes 54 and 72, protecting them against arcing.

The temperature probes 54 and 72 are spring loaded so that they rpess against the conductor when the unit is closed. An ambient probe 74 is provided with a shield 200 covering the hub area so that it looks at the temperature of the shield 200 rather than the temperature of the conductor.

The temperature probes 54 and 72 are at an angle of less than 180° on the lower side of the donut 40 so that they may be pushed against conductor 42 with the donut open for an instantaneous measurement of conductor temperature.

Now referring to FIG. 6, a Rogowski coil 48 is affixed to the covers 81 by eight brackets 202. The nonconductive rubber seal 188 may be seen in FIG. 7.

The conductor temperature probes 22, 54, and 72 (as shown for probe 54 in FIG. 6) comprise an Analog Device AD-590 sensor 52 mounted against a beryllia insert 56 which contacts the conductor. The three conductors generally indicated at 222 connect the electronics to the sensor 220 through a sealed pass through 223 and through a MOV 224.

The sensor 52 and beryllia insert 56 are mounted in a probe head 226 which in turn is mounted to a generally cylindrical carriage 227 pushed out by spring 228 to force the beryllia insert 56 against the conductor. A rubber boot 29 protects the interior of the probe 54. The probe head 226 is formed of an electrical and heat insulating material. The probe 54 is mounted in a concentric cylindrical post 230 which preferably is adjustable in and out of the lower casing 76 for adjustment to engage conductors of differing diameters. The other conductor temperature probes are identical.

Figure 7:
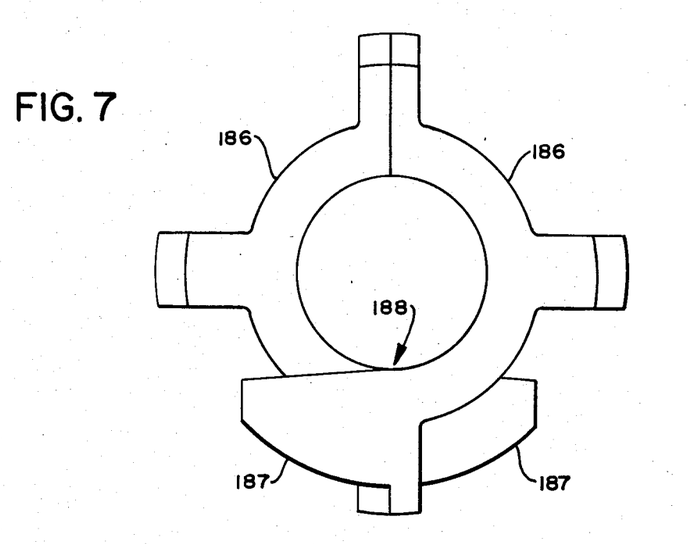
FIG. 7 is a plan view of the jaw inserts for the module illustrated in FIG. 4.

In FIG. 7 it can be seen that the overlapping lower portions 187 of the jaws inserts 186 provide a cable stop at 188 when the donut 40 is open.

Figure 8:
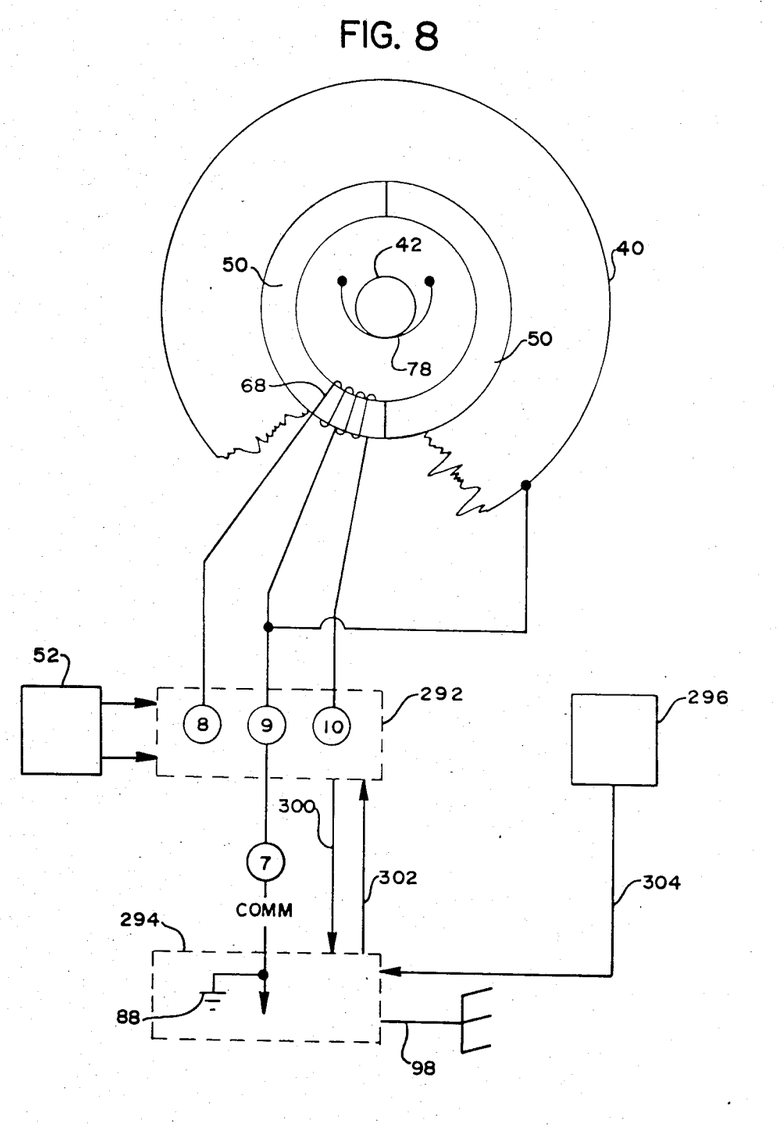
FIG. 8 is a schemmatic electrical diagram of the module illustrated in FIG. 2.

The module electronics of the donut 40 are shown in their overall configuration in FIG. 8. They comprise a power supply 292, digitizing and transmitting electronics 294, sensors indicated by the box 296, and antenna 98.

The center tap 9 of the power pickoff coil 68 is connected to the aluminum shell of the module 40, which in turn is connected directly to the power conductor 42 by spring 78 and by the conducting inserts 186 (FIGS. 4 and 7). Thus, the power conductor 22 becomes the local ground as shown at 88 for the electronics 294. The power supply supplies regulated +5 and −8 volts to the electonics 294 and an additional switched 5.75 volts for the transmitter as indicated at 300. The electronics 294 provides a transmitter control signal on line 302 to control the power supply to the transmitter. The sensors 296 provide analog signals as indicated at 304 to the electronics 294. A detailed schematic electrical circuit diagram of the power supply 292 is shown in the above-identified co-pending application.

A battery 52 may be provided for powering the unit when the donut is open for taking instantaneous measurements of temperature and conductor potential. For short term mounting on a conductor 42, the core 50 may be dispensed with and power derived from the battery. Alternatively, when the core 50 is utilized, the power supply 292 includes appropriate means for switching from battery power to conductor supplied power when the unit is closed about conductor 42.

For complete details of a method of transmitting the temperature potential and current measurements to the ground reference should be had to the above-identified co-pending application. Similar reference should be made to that application for an explanation of the operation of the potential measuring capacitor plates 46—46 of the donut 40 and the similar capacitor plates 28—28 of donut 20.

Thus we have disclosed how the state estimator modules of the above-identified co-pending application may be modified, in particular by locating the temperature probes at an angle of less than 180° apart on the lower side of the module such that the angle between them is bisected by the hot stick so that the state estimator module may be utlized with battery power to take instantaneous measurements of temperature and potential. We have also disclosed how the housing of the state estimator module disclosed in our above-identified co-pending application can be utilized for a temperature and potential measuring probe as shown in FIG. 1 hereof by dispensing with the hinge clamping mechanism and permanently spacing the donut open with a cable stop 34, again locating temperature probes on the lower side at an angle of less than 180°, which angle is bisected by the hot stick and deriving power from a battery 30.

It will thus be seen that the objects set forth above, among those made apparent from the preceding description, are efficiently attained and, since certain changes may be made in the above constructions without departing from the scope of the invention, it is intended that all matter contained in the above description, or shown in the accompanying drawings, shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described our invention, what we claim as new and desire to secure by Letters Patent is:

1. Apparatus for measuring the temperature of an electric power conductor comprising:
    a housing with an opening for receiving said power conductor;
    said housing including means for mounting said housing on a hot stick;
    at least one conductor temperature sensor resiliently mounted to said housing for engagement with said conductor and for measuring the temperature of said conductor with said housing in an open position;
    said housing including means for transmitting said measured temperature to a ground receiver; and
    said housing further including a battery for powering said temperature sensor and said means for transmitting, whereby instantaneous measurements of said conductor can be made at arbitrary points along said conductor.

2. Apparatus as defined in claim 1 further including; an insert in heat conducting engagement with said temperature sensor and adapted to engage an electric power conductor, said insert being formed of material that is a relatively good conductor of heat and a relatively poor conductor of electricity.

3. Apparatus as defined in claim 2 wherein said insert is formed of beryllia.

4. Apparatus as defined in claim 1 comprising two of said temperature sensors mounted to engage said electric power conductor at an angle of substantially less than 180°, whereby said resiliently mounted temperature sensors may be pushed up into engagement with said conductor when said conductor is received in said opening of said hot stick mountable housing.

5. Apparatus as defined in claim 4 wherein said means for mounting said housing on a hot stick is located such that a hot stick attached to said housing substantially bisects the angle between said temperature sensors.

6. Apparatus as defined in claim 1 wherein said resilient mounting for said temperature sensor comprises:
    a first cylinder mounted to said housing;
    a second concentric cylinder to which said sensor is mounted; and
    spring means resiliently forcing said cylinders axially apart, whereby said sensor is pushed against said conductor when said conductor is received within said housing.

7. Apparatus as defined in claim 6 further comprising:
    a waterproof boot connected between said cylinders.

8. Apparatus as defined in claim 7 further comprising:
    an electrical and heat insulating probe head mounted to the outer end of said second cylinder, said sensor being mounted in said probe head.

9. Apparatus as defined in claim 8 further comprising:
    an insert mounted in the outer end of said plug head in heat conducting contact with said sensor, said insert adapted to contact said electrical power conductor, and said insert being formed of material that is a relatively good conductor of heat and a relatively poor conductor of electricity.

10. Apparatus as defined in claim 9 wherein said insert is formed of beryllia.

11. Apparatus as defined in claim 1 further comprising:
    means mounted to said housing for measuring at least one electrical characteristic of said electric power conductor and wherein said transmitting means is adapted to transmit said measured electrical characteristic to said ground receiver.

12. Apparatus as defined in claim 11 wherein said characteristic is electrical potential.

13. Apparatus as defined in claim 11 wherein said characteristic is electrical current.

14. Apparatus as defined in claim 11 wherein said characteristics include electrical potential and current.

15. Apparatus as defined in any of claims 1 through 14 in which said housing further comprises:
    conductor clamping means for permanently mounting said housing on said electric power conductor by said hot stick.

16. Apparatus as defined in any of claims 1 through 14 wherein said housing is in the form of a jaws-like open torus.

17. Apparatus as defined in claim 15 further comprising:
    means in said housing for deriving power from said electric power conductor and for powering said sensor and said transmitting means when said housing is permanently mounted on said conductor.

* * * * *